United States Patent
Wu et al.

(10) Patent No.: US 9,827,635 B2
(45) Date of Patent: Nov. 28, 2017

(54) FIXTURE FOR USE WITH FINE WIRE LASER SOLDERING

(71) Applicant: TYCO ELECTRONICS CORPORATION, Berwyn, PA (US)

(72) Inventors: Huadong Wu, Hershey, PA (US); Yasser M. Eldeeb, Harrisburg, PA (US)

(73) Assignee: TE Connectivity Corporation, Berwyn, PA (US)

( * ) Notice: Subject to any disclaimer, the term of this patent is extended or adjusted under 35 U.S.C. 154(b) by 0 days.

(21) Appl. No.: 14/879,804

(22) Filed: Oct. 9, 2015

(65) Prior Publication Data
US 2017/0100803 A1 Apr. 13, 2017

(51) Int. Cl.
| B23K 37/00 | (2006.01) |
| B23K 37/04 | (2006.01) |
| H05K 3/00 | (2006.01) |
| H05K 3/10 | (2006.01) |

(52) U.S. Cl.
CPC ...... B23K 37/0435 (2013.01); B23K 37/0443 (2013.01); H05K 3/0008 (2013.01); H05K 3/103 (2013.01); *H05K 2203/049* (2013.01); *H05K 2203/107* (2013.01)

(58) Field of Classification Search
CPC ....... B23K 1/005–1/0056; B23K 37/04; B23K 37/0426–37/0443
USPC .......... 228/4.5, 180.5, 904, 44.3, 44.7, 49.1, 228/49.5, 212–213; 219/121.63–121.64, 219/158, 161
See application file for complete search history.

(56) References Cited

U.S. PATENT DOCUMENTS

| 2,961,759 A | * | 11/1960 | Weissfloch | H01J 19/00 228/180.1 |
| 3,051,026 A | * | 8/1962 | Da Costa | B23P 19/001 219/79 |
| 3,132,239 A | * | 5/1964 | Schollhammer | B23K 15/0046 219/121.14 |
| 3,592,096 A | * | 7/1971 | Ritter | G10D 3/143 84/312 P |
| 3,807,620 A | * | 4/1974 | Paquette | B23K 31/12 140/92.2 |
| 3,945,114 A | * | 3/1976 | Siden | H01R 43/00 174/112 |
| 3,995,845 A | * | 12/1976 | Scheffer | B23K 20/10 228/180.5 |
| 4,114,014 A | * | 9/1978 | Shogo | H01B 13/01245 219/56 |

(Continued)

FOREIGN PATENT DOCUMENTS

| JP | 01104489 A | * | 4/1989 |
| JP | 06304771 A | * | 11/1994 |

*Primary Examiner* — Kiley Stoner

(57) ABSTRACT

A fixture assembly for use with fine wire laser soldering. The fixture includes a holding and support fixture and a wire securing and tensioning fixture. The holding and support fixture has a wire holding member and a retention member. The wire holding member and the retention member cooperate with wires prior to the wires being soldered. The wire securing fixture has wire tensioning projections and wire retention members. The wire tensioning projections and wire retention members cooperate with the wires to provide tension to the wire prior to the wires being soldered.

13 Claims, 6 Drawing Sheets

(56) References Cited

U.S. PATENT DOCUMENTS

| | | | | |
|---|---|---|---|---|
| 4,811,936 A * | 3/1989 | Laymaster | ......... | B23K 37/0435 |
| | | | | 269/43 |
| 5,029,511 A * | 7/1991 | Rosendahl | ............. | G10H 3/181 |
| | | | | 84/723 |
| 5,054,356 A * | 10/1991 | Farnell, Jr. | ............... | G10D 3/02 |
| | | | | 84/291 |
| 5,212,329 A * | 5/1993 | Woodworth | ........... | G10D 15/00 |
| | | | | 84/263 |
| 5,269,056 A * | 12/1993 | Yang | ................. | H01R 43/0221 |
| | | | | 219/121.63 |
| 5,300,755 A * | 4/1994 | Nishitani | ............... | B23K 26/22 |
| | | | | 219/121.63 |
| 5,935,463 A * | 8/1999 | Sugiura | ................. | B23K 26/20 |
| | | | | 219/121.64 |
| 6,068,174 A * | 5/2000 | Ball | ..................... | B23K 3/0623 |
| | | | | 228/4.5 |
| 8,025,201 B2 * | 9/2011 | Miller | ..................... | H01L 23/66 |
| | | | | 228/180.5 |
| 8,186,041 B1 * | 5/2012 | Walker | ................. | H01R 43/205 |
| | | | | 219/85.18 |
| 8,701,966 B2 * | 4/2014 | Nikkhoo | ............ | H05K 13/0015 |
| | | | | 219/605 |
| 2002/0074383 A1 * | 6/2002 | Kondo | ............... | B23K 37/0443 |
| | | | | 228/212 |
| 2008/0191367 A1 * | 8/2008 | Kim | ................... | H01L 25/0657 |
| | | | | 257/784 |
| 2008/0302858 A1 * | 12/2008 | Delrosso | ................ | H01L 24/77 |
| | | | | 228/175 |
| 2016/0346858 A1 * | 12/2016 | Shen | ................... | B23K 1/0056 |

* cited by examiner

FIXTURE FOR USE WITH FINE WIRE LASER SOLDERING

FIELD OF THE INVENTION

The present invention is directed to a fixture for use in a soldering automation system. More particularly, the present invention is directed to a fixture to support and align fine wires during a laser soldering process.

BACKGROUND OF THE INVENTION

Wire soldering can be a complex process, especially when working with small wires and small termination traces on circuit boards. Soldering can require substantially complicated manual operations almost at the limit of hand-eye coordination systems' capability aided by microscopes to properly align and terminate the small wires. For example, soldering wires of sizes 44 American Wire Gauge (wire diameter of 0.050 millimeters) onto pad traces having widths of 0.050 millimeters, with gaps of 0.050 millimeters between such pad traces, onto a substrate laminate having a thickness of 0.025 millimeters is possible only under microscope.

On average, it takes more than three hours for a well-trained human operator to align the wires and complete such soldering of a typical component having 64 solder joints. The cost associated with the well-trained operator expending such an amount of time results in such components is fairly expensive and limited in supply. In addition, although the well-trained operators are able to produce a such delicate components to achieve the desired function, the soldering quality within the 64 solder joints is inconsistent. Some of the solder joints will have higher quality than other solder joints. The inability to have all of the solder joints at the higher quality is an overall limitation of such techniques.

The traditional hot iron tip soldering process by a human operator involves many complicated maneuvers and delicate wire manipulation operations, including: (1) straightening a section of the wire, positioning and aligning it onto its corresponding pad trace; (2) holding the aligned wire section in place at clamping points so the to be soldered section is visible and accessible by the hot iron tip (force feedback control is practically excised to keep proper touch during the solder reflowing process when the wire-pad relative position may change); (3) moving hot iron tip to touch the soldered sections and to reflow the already pre-tinned solder material; and (4) removing the hot iron tip quickly, finishing contact once the reflowing is observed to reach required span and the soldered wire is properly seated in place.

Generally, robotic positioning and manipulation of the fines wires has not been utilized in such circumstances due to the complexity and the delicate nature of such components. To date, such operations have been hampered by the lack of a supportive wire holding fixture which is suitable for use in large batch manufacturing and which can be used to pre-align, manipulate and maintain the fine wires in position during such processes.

It would, therefore, be beneficial to provide a holding and support fixture that includes one or more improvements in comparison to the prior art. In particular, it would be beneficial to provide a holding and process-facilitating fixture which i) arranges components to be soldered in a configuration optimized for a wire soldering process with one end of the soldering section pre-aligned, ii) maintains the fine wires in a spread arrangement, iii) stretches the fine wires to control the wire tension, iv) makes wire loading easier, v) provide a position adjustment, or vi) any combination thereof

SUMMARY OF THE INVENTION

An embodiment is directed to a fixture assembly for use with fine wire laser soldering. The fixture includes a holding and support fixture and a wire securing and tensioning fixture. The holding and support fixture has a wire holding member and a retention member. The wire holding member and the retention member cooperate with wires prior to the wires being soldered. The wire securing fixture has wire tensioning projections and wire retention members. The wire tensioning projections and wire retention members cooperate with the wires to provide tension to the wire prior to the wires being soldered.

An embodiment is directed to a fixture assembly which includes a substrate adjusting fixture which has a first member and a second member which is movable relative to the first member. The first member has a first substrate receiving cavity, and the second member has a second substrate receiving cavity. The first and second substrate receiving cavities are dimensioned to receive the substrate therein. Wherein as the second member is moved relative to the first member, the second substrate receiving cavity is moved relative to the first substrate receiving cavity.

An embodiment is directed to a holding and support fixture. The holding and support fixture includes a wire holding member and a retention member. The wire holding member has a wire-alignment device positioned proximate a first end of the wire holding member. The retention member extends from the wire holding member and has a wire retention section which is spaced from the wire holding member.

An embodiment is directed to a wire securing fixture having wire tensioning projections and wire retention members. The wire tensioning projections and wire retention members cooperate with the wires to provide tension to the wire prior to the wires being soldered.

An embodiment is directed to a wire securing fixture in which respective wire tensioning projections are provided in rows, with three wire tensioning projections in each row. Middle wire tensioning projections of each row of wire tensioning projections are provided on a movable member, the moveable member movable in a direction which is perpendicular to the plane formed by each of the rows of wire tensioning projections.

Other features and advantages of the present invention will be apparent from the following more detailed description of the preferred embodiment, taken in conjunction with the accompanying drawings which illustrate, by way of example, the principles of the invention.

DETAILED DESCRIPTION OF THE INVENTION

Figure 1:
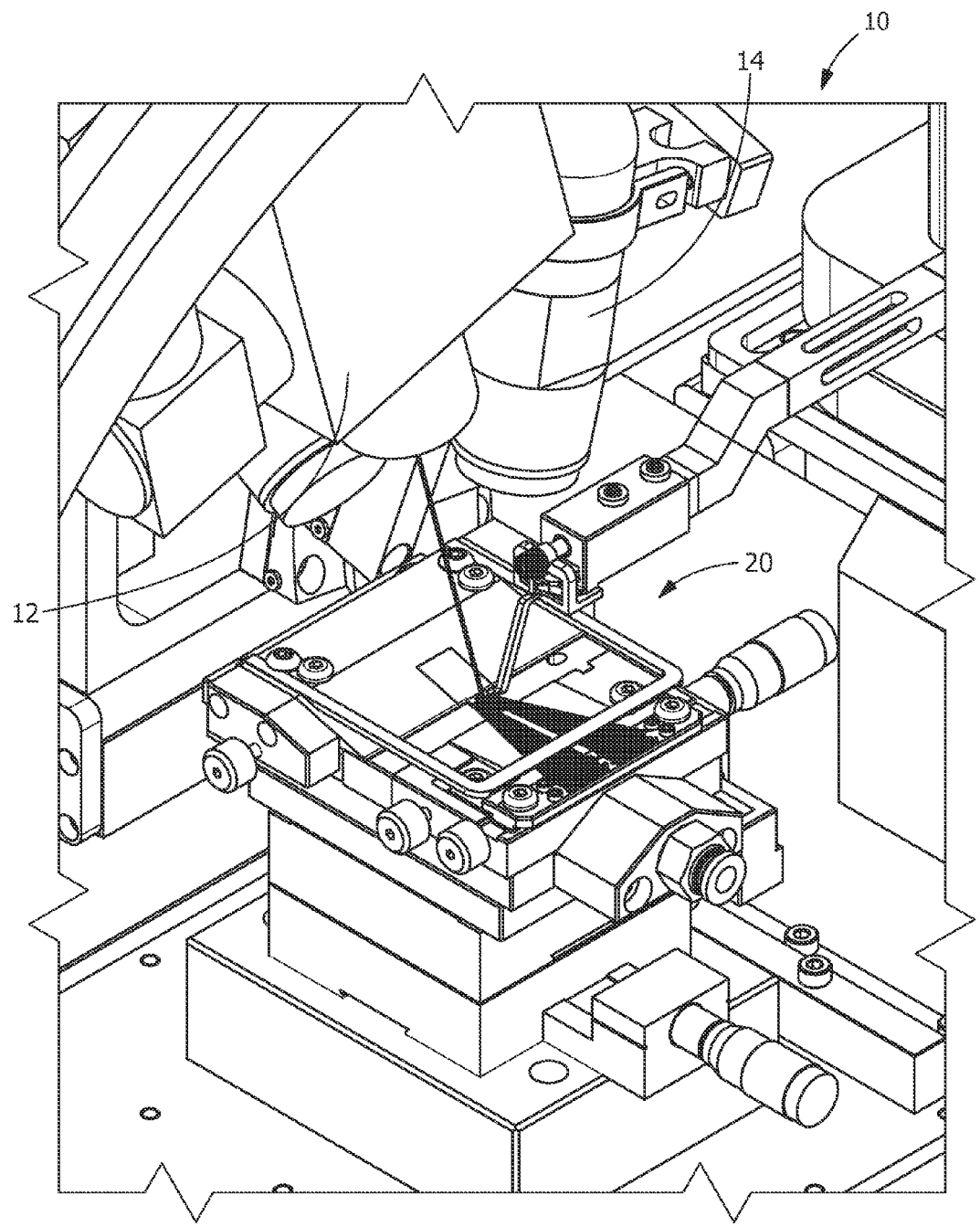
FIG. 1 is a perspective view of an illustrative embodiment of a device for manipulating and soldering fine wires to a substrate, the device including a holding and support assembly according to the present invention.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features, the scope of the invention being defined by the claims appended hereto.

Referring to FIG. 1, an illustrative embodiment of a wire soldering device 10 is shown. The device 10 includes a laser 12 which can generate a laser of varying intensity. The device 10 also includes a detection device 14, such as, but not limited to, a computer vision system with long focal-length camera capable of sensing infrared and visible light from a long distance.

The laser soldering process includes a first or initial step of beaming a lower-intensity laser beam from the laser 12. The infrared laser reflection or feedback of the lower-intensity laser beam in relation to the fine wire 111 and the conductive member on the substrate 203 is analyzed, either directly or indirectly, using the detection device and/or the camera. Based on the feedback, the position of the lower-intensity laser beam of the laser 12 is adjusted to fine-tune its position and incident angle of the lower-intensity laser beam, resulting in the lower-intensity laser beam being moved to a second position. Once the lower-intensity laser beam has been properly adjusted, the higher-intensity laser beam of the laser 12 is beamed at the same position with the same incident angle, such that the higher-intensity laser beam corresponds with the infrared feedback of the lower-intensity laser beam. The lower-intensity laser beam generates a lower temperature below the soldering temperature of the solder material pre-tinned on the wire 111 and the conductive member on the substrate 203, such that the solder material is not melted until the beam is properly adjusted. In contrast, the higher-intensity laser beam has an intensity resulting in a temperature above the soldering temperature threshold with an experimentally pre-determined intensity-over-time profile which generates a higher temperature above the soldering temperature, thereby allowing the higher-intensity laser beam to melt the solder when the higher-intensity laser beam is positioned at the optimum position to ensure proper solder material reflow to reform a high-quality bonding.

The fine wires 111 may be wires having a diameter of less than 0.5 millimeters, including, but not limited to, 0.3 millimeters (AWG 30), 0.2 millimeters (AWG 32), 0.1 millimeters (AWG 38), 0.09 millimeters (AWG 39) and 0.05 millimeters (AWG 44).

The substrate 203 maybe a rigid or flexible material composite structure with conductive members made of compatible material with the solder material. Examples include, but are not limited to, small and thin conductive printed metallic circuit traces/pads on a printed circuit board. In one illustrative embodiment, the conductive member is copper base conductive metallic alloy trace pads bonded onto a flexible material, for example, a polyimide material substrate. The conductive member has a thickness depending upon the materials and arrangement utilized. Suitable thicknesses of the conductive member include, but are not limited to, 0.5 millimeters (for example, IPC L4), 0.2 millimeters (for example, IPC L4), 0.15 millimeters (for example, IPC L3), 0.10 millimeters (for example, IPC L2), 0.05 millimeters (for example, IPC L1).

A more detailed description of the soldering process associated with the illustrative embodiment of the wire soldering device 10 can be found in U.S. patent application Ser. No. 14/879,479, entitled Laser Soldering Process, filed on even date herewith, which is hereby incorporated by reference in its entirety.

The geometric structure and dimensions of the conductive member, the substrate 203 upon which the conductive member is positioned, the solder material, and/or their relative positions are compatible with the laser soldering process. For example, in one illustrative embodiment, the total thickness of the conductive member and/or substrate 203 is 0.051 millimeters, in which the conductive member is a double-sided component having printed circuitry traces with pitch as narrow as 0.1 millimeters and circuitry trace and pad width as narrow as 0.051 millimeters, the conductive member having a complex geometric structure and very fine scale dimensions which causes soldered components to be vulnerable to thermal stress damage. Accordingly, the laser soldering process is accurately controlled to control the laser beam location, the incident angle and the laser beam power intensity profile such that the resulting peak temperature of the conductive member and the substrate 203 has large safety margin below the conductive member and the substrate maximal allowable temperature and, ideally, below a maximum 260° C. working temperature to prevent degradation of the conductive member and/or the substrate 203. Stated differently, laser power intensity of the higher-intensity laser beam is controlled to ensure that given the thickness of the conductive member and/or substrate 203 is greater than a suitable thickness that prevents thermal degradation of the conductive member and/or substrate 203.

In order to effectively and securely terminate the fine wires 111 to the conductive members of the substrate 203, the fine wires 111 and substrate 203 must be properly positioned relative to each other as the soldering process occurs. The holding and support assembly 20 cooperates with the fine wires 111 and substrate 203 to properly position the fine wires 111 and substrate 203 to allow the soldering process to be accurately performed.

Figure 2:
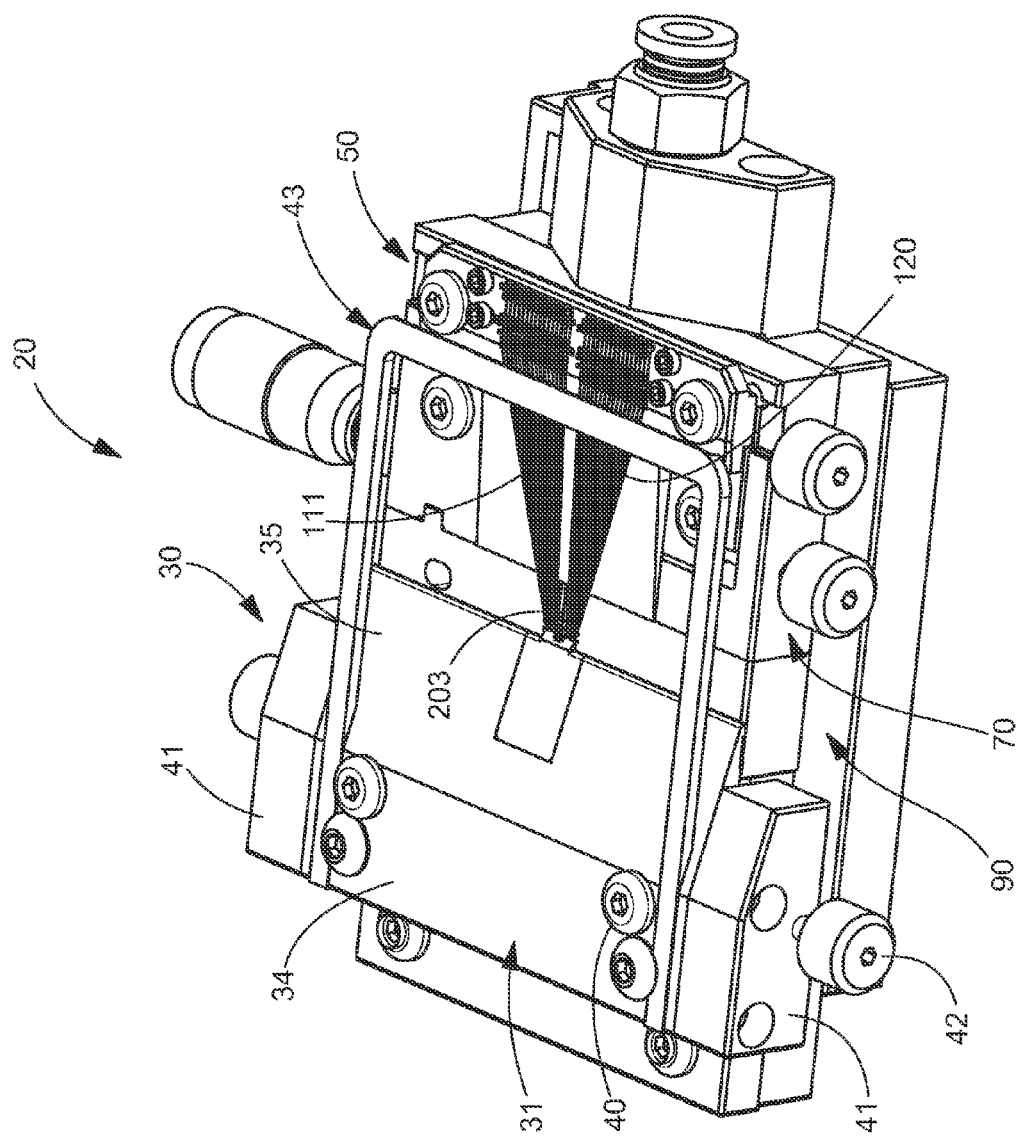
FIG. 2 is a top perspective view of the holding and support assembly removed from the device.

As best shown in FIG. 2, the holding and support fixture assembly 20 includes a holding and support fixture 30, a wire securing and tensioning fixture 50 and a substrate adjusting fixture 70. In the illustrative embodiment shown, the holding and support fixture 30 and the substrate adjusting fixture 70 are mounted on a base 90. The wire securing and tensioning fixture 50 is mounted on the substrate adjusting fixture 70.

Figure 3:
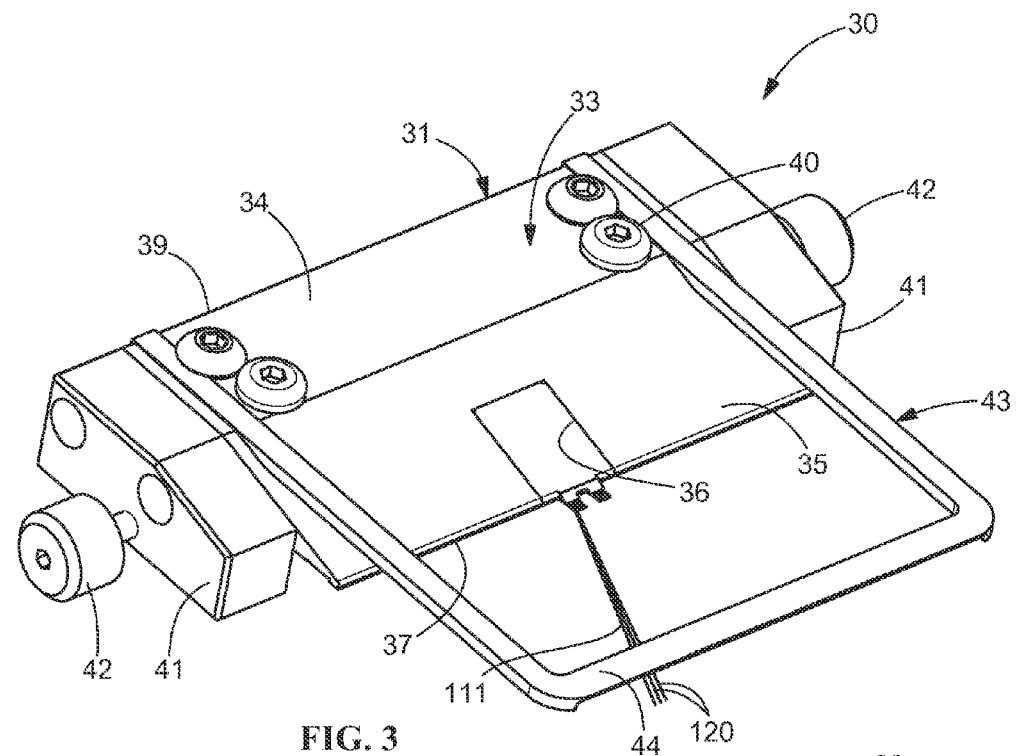
FIG. 3 is a top perspective view of an illustrative embodiment of a holding and support fixture of the holding and support assembly.
Figure 4:
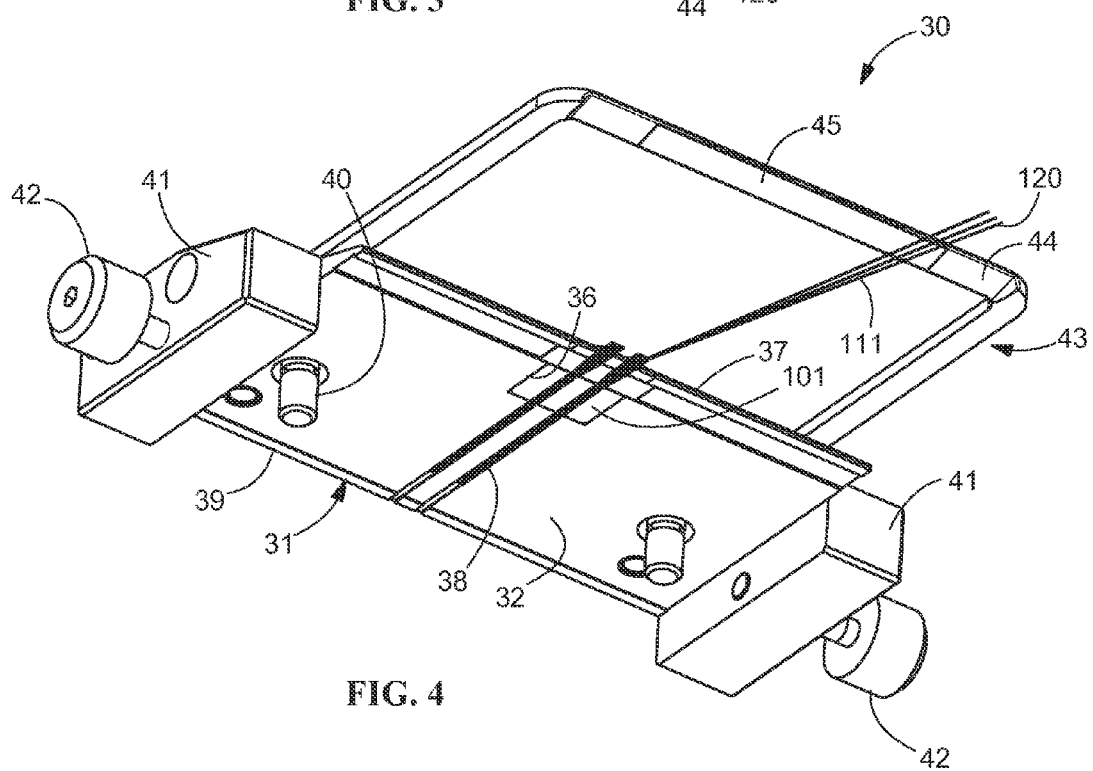
FIG. 4 is a bottom perspective view of the holding and support fixture of FIG. 3.

The holding and support fixture 30, as best shown in FIGS. 3 and 4, includes a wire holding section or member 31. The wire holding member 31, in the embodiment shown, has planar bottom surface 32. The top surface 33 has a first portion 34, which is essentially parallel to the bottom surface 32, and a second portion 35, which tapers from the plane of the first portion 34 to the plane of the bottom surface 32.

A wire alignment device receiving recess 36 extends from the bottom surface 32 toward the second portion 35 of the top surface 33. In the illustrative embodiment shown, the wire alignment device receiving recess 36 extends through the second portion 35 of the top surface 33. The wire alignment device receiving recess 36 is positioned proximate to or adjacent a first end 37 of the holding and support fixture 30. A wire receiving recess 38 is provided in the bottom surface 32. The wire receiving recess 38 extends from the wire alignment device receiving recess 36 to a second end 39 of the holding and support fixture 30.

Positioning hardware 40 extends through the holding and support fixture 30 to cooperate with the base 90 to accurately position the holding and support fixture 30 relative to the base 90 and the other components of the holding and support assembly 20. Mounting members 41 are provided on either side of the holding and support fixture 30. The mounting members 41 have mounting hardware 42 which is movable between a first position and a second position. The mounting hardware 42 cooperates with the base 90 to achieve high-accuracy lateral position fine tuning between the holding and support fixture 30 and the base 90. The mounting hardware 42 cooperate with the base 90 to removably mount the holding and support fixture 30 to the base 90.

A retention structure or member 43 extends from the first portion 34 of the top surface 33. In the illustrative embodiment shown, the retention member 43 has a U-shaped configuration, with the base 44 of the U-shape having a wire retention section 45. The wire retention section 45 is spaced from the first end 37 of the wire holding member 31 and the wire alignment device receiving recesses 36. The wire retention section 45 cooperates with the wires 111 to temporarily secure the wires 111 in position, as will be more fully described. In the illustrative embodiment shown, the wire retention section 45 uses adhesively coupling (for example, with an adhesive or a double-sided tape positioned on the wire retention section 45). However, other methods of temporarily securing the wires 111 can be used.

Figure 5:
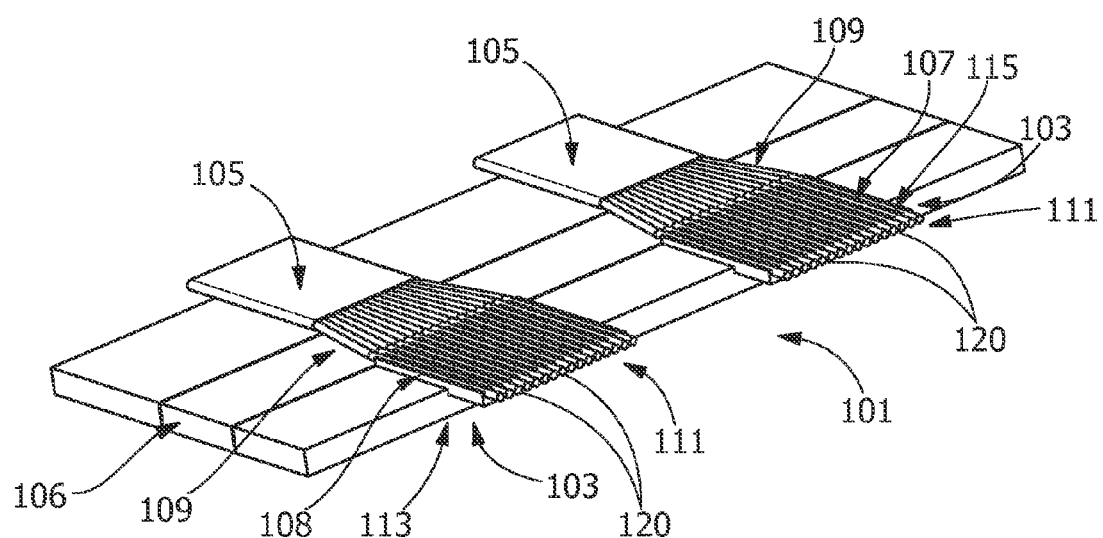
FIG. 5 is a perspective view of an illustrative embodiment of a wire-alignment device used with the holding and support fixture of FIGS. 3 and 4.

A wire-alignment device 101 is positioned in the wire alignment device receiving recess 36. As best shown in FIG. 5, the wire-alignment device 101 includes an arrangement of grooves 108 for positioning and temporary-securing of loading regions 103 of a plurality of wires 111.

The loading of the loading regions 103 produces diverging regions 109 of the plurality of the wires 111 leading to the loading regions 103 and soldering regions 107 oppositely extending from the loading regions 103. Center-to-center pitch distances and/or diameters of the wires 111 within a wire band region 105 are the same or different compared to the wires in the loading regions 103 and/or the soldering region 107. Different diameters in the wire band region 105 and the loading region 103 may be due to the wires being pre-tinning. In one embodiment, the loading is achieved by an individual able to arrange each of the loading regions 103 for each of the wires 111 from the band region 105 into each of the grooves 108, such that only one of the wires 111 from the band region 105 is present in each of the grooves 108 and such that each of the wires 111 from the band region 105 is aligned sequentially within only one of the grooves 108.

The temporary-securing of the loading regions 103 aids the loading. As used herein, the phrase "temporary-securing" is intended to encompass concepts that prevent the loading regions 103 from separating from the wire-alignment device 101 during the wire-alignment process or portions of the wire-alignment process. The temporary-securing is capable of utilizing techniques that would secure for a limited time, independent of forces applied, and/or for any suitable time, dependent upon forces applied.

Suitable techniques capable of being used for the temporary-securing include, but are not limited to, adhesively coupling the diverging regions 109 and/or any other portion of the plurality of the wires 111 (for example, with an adhesive or a double-sided tape positioned within a recessed region 106 of the wire-alignment device 101).

The wires 111, when positioned within the groove arrangement 113, extend have ends 120 which extend beyond the grooves 108 of the wire-alignment device 101 and beyond the first end 37 of the holding and support fixture 30. The ends 120 extend to and are temporarily secured to the wire retention section 54 of the retention member 43. The wire retention section 45 cooperates with the wires 111, by applying a retention force to the wires 111 so that the loading region 103 is maintained in the grooves 108, thereby preventing loosening of the wires 111 during the loading process. For example, upon the wire-alignment device 101 and the holding and support fixture 30 properly mounted on the base 90, as illustrated in FIG. 2, the wires 111 are confined between the grooves and the substrate 203.

The wire holding member 31 and the retention member 43 cooperate with wires 111 prior to the wires 111 being soldered. As best shown in FIG. 2, the ends 120 of the wires 111 are loaded or positioned in a spread arrangement with the maximum wire spread angle controlled to ensure that the conductive elements of the substrate (i.e. pad traces on a flexible printed circuit board) are visible. This allows the robotic equipment to properly view the conductive elements and move the respective wires 111 into precise position for soldering.

Once the wires 111 are properly positioned in the grooves 108 and the holding and support fixture 30 is properly positioned and secured to the base 90, the ends 120 of the wires are removed from the wire retention section 45 of the retention member 43. As this occurs, each respective end 120 of the wire is moved into engagement with the wire securing and tensioning fixture 50.

Figure 6:
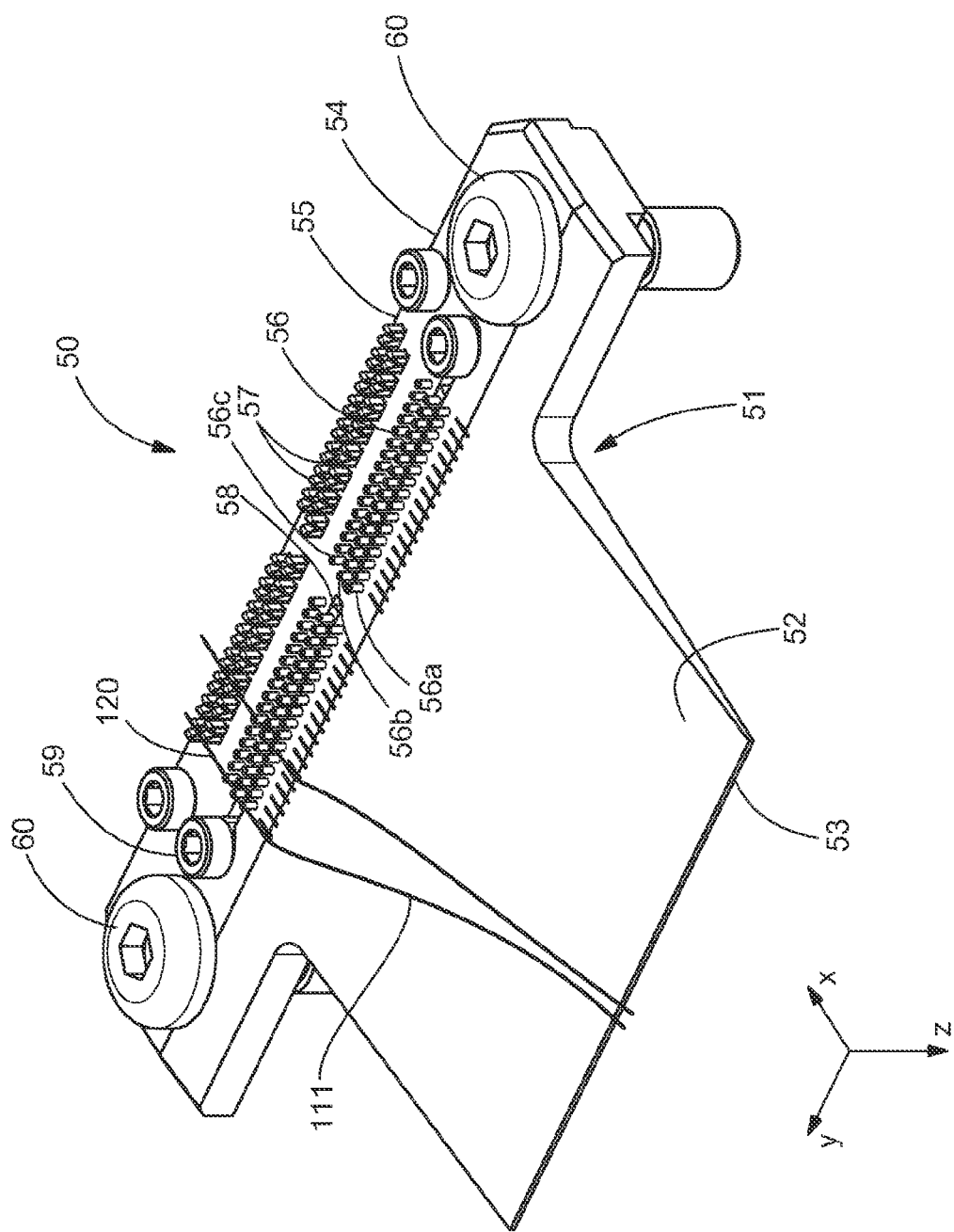
FIG. 6 is a top perspective view of an illustrative embodiment of a wire securing and tensioning fixture of the holding and support assembly.

The wire securing and tensioning fixture 50, as best shown in FIG. 6, includes a base 51. The base 51 has a sloped section 52, which extends from a first end 53, and a mounting section 54, which is positioned proximate a second end 55. The mounting end 54 includes wire tensioning projections 56 and wire retention members 57.

In the embodiment shown, respective wire tensioning projections 56 are provided in rows, with three projections in each row. However, other numbers of projection 56 can be provided in each row. The wire tensioning projections 56 have rounded or arcuate surface to allow the wires 111 to engage therewith without damaging the wires 111. In the embodiment shown, the wire tensioning projections 56 are cylindrical members.

A respective wire retention member 57 is provided in line with each row of the wire tensioning projections 56. In the embodiment shown, each wire retention member 57 is spaced from the row of wire tensioning projections 56. The wire retention members 57 are arranged in a staggered configuration to allow for closer spacing of the rows of wire tensioning projections 56.

In the embodiment shown, the middle projection 56*b* of each row of wire tensioning projections 56*a*, 56*b*, 56*c* is provided on a movable member 58. The moveable member 58 is movable in a direction which is perpendicular to the plane formed by each of the rows of wire tensioning projections 56. An adjustment member 59 is located proximate each movable member 58.

Mounting hardware 60 extends through the mounting end 54. The mounting hardware properly aligns and secures the wire securing and tensioning fixture 50 to the substrate adjusting fixture 70.

With the wires 111 are properly positioned in the grooves 108 and the holding and support fixture 30 is properly positioned and secured to the base 90, the ends 120 of the wires are removed from the wire retention section 54 of the retention section 53. As this occurs, each respective end 120 of the wire is moved into engagement with the wire tensioning projections 56 and the wire retention members 57 of the wire securing and tensioning fixture 50. The end 120 of wire 111 is positioned in a respective row of wire tensioning projections 56 in a zigzag configuration, whereby the wire 111 is positioned on the same side of wire tensioning projections 56*a* and 56*c* and on the opposite side of 56*b*.

In one illustrative embodiment, in order to facilitate the insertion of the end 120 of the wire 111 through the wire tensioning projections 56, the middle projection 56*b* may be initially offset from the other wire tensioning projections 56*a*, 56*c*. This allows the end 120 of the wire 111 to be fed through the wire tensioning projections 56 in a straight path. Once all wires 111 are properly fed through wire tensioning projections 56, the movable member 58 is moved, causing the wire tensioning projections 56*b* to move back into alignment with wire tensioning projections 56*a* and 56*c*. In so doing, the wire 111 is wrapped around the wire tensioning projections 56 is the zigzag formation previously described.

With the end 120 of the wire 111 properly positioned in the wire tensioning projections 56, the end 120 of the wire is pulled to position the wire 111 in tension. As this occurs, the spacing and configuration of the wire tensioning projections 56 cooperates with the wire 111 without causing damage thereto. Once the wire 111 is properly tensioned, the end 120 of the wire 111 is inserted into the wire retention members 57. The wire retention member 57 cooperates with the wire 111 to maintain the wire 111 in position and in tension. In the embodiment shown, the wire retention members 57 are in the form of an IDC terminal. However, other types of wire retention members 57 can be used.

The use of the wire securing and tensioning fixture 50 provides a method of stretching the wires 111 to control the wire tension, thereby facilitating the proper initial positioning of the wires 111 with respect to the conductive members of the substrate 203. The tensioning of the wires 111 allows the wires 111 to be better controlled in the X, Y and Z axis.

Figure 7:
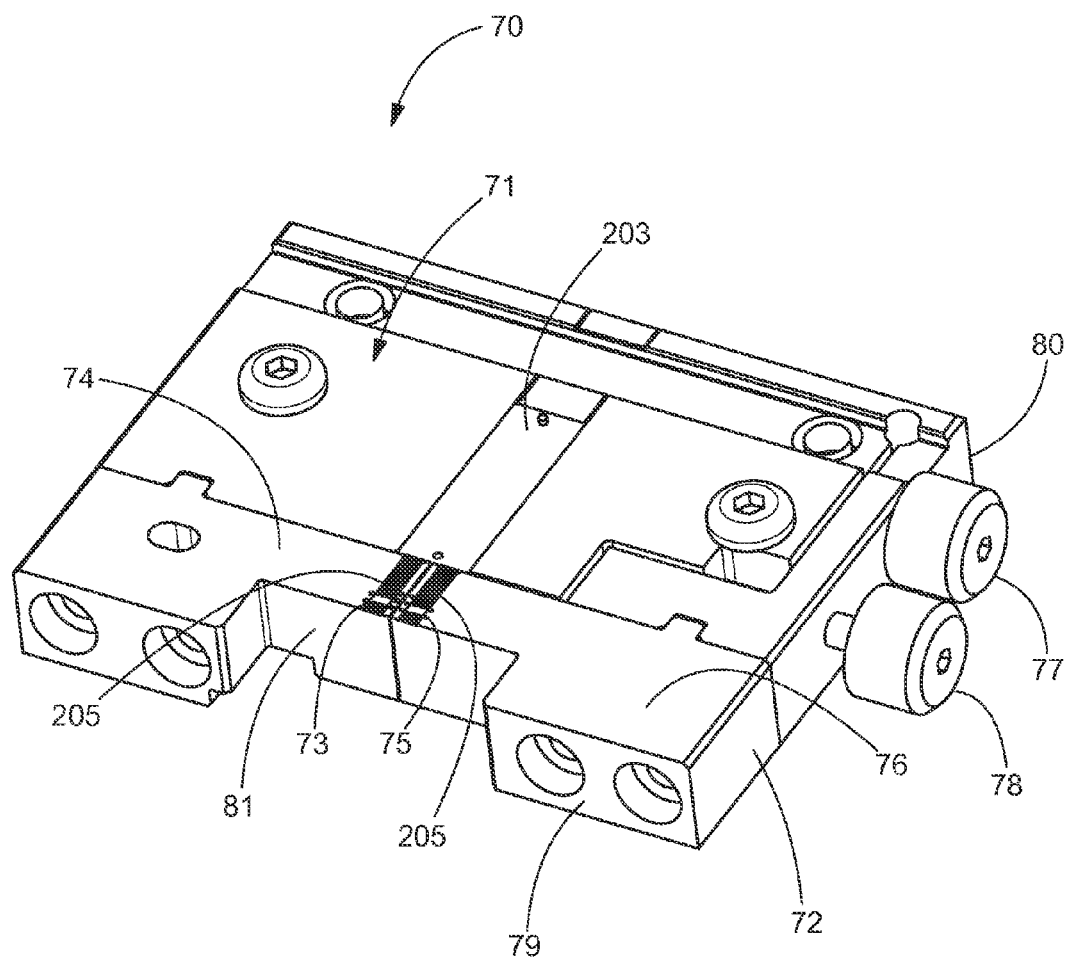
FIG. 7 is a top perspective view of an illustrative embodiment of a substrate adjusting fixture of the holding and support assembly.

Referring to FIG. 7, the substrate adjusting fixture 70 is shown. The substrate adjusting fixture 70 is an optional feature which may be used when a substrate 203, such as, but not limited to, a flexible printed circuit board, is used. The substrate adjusting fixture 70 allows movement of the substrate 203 relative to the wires 111, thereby accommodating the flexibility and deformation of the flexible circuit board.

The substrate adjusting fixture 70 has a first member 71 and a second member 72 which is movable relative to the first member 71. The first member 71 has a first substrate receiving cavity or recess 73 extending from a surface 74 thereof The second member 72 has a second substrate receiving cavity or recess 75 extending from a surface 76 thereof The substrate receiving cavities 73, 75 are dimensioned to receive ends 205 of a substrate 203 therein. The cavities may have openings (not shown) in a surface thereof The openings are connected to a vacuum line or the like to provide suction to maintain the ends 205 of the substrate 203 in a flat controlled position. The first member 71 is connected to the second member 72 by pulling-adjustment hardware 77 and pushing-adjustment hardware 78. As the respective adjustment hardware 77, 78 is moved, the free end 79 of the second member 72 is forced to move relative to the fixed end 80 of the second member 72. As this occurs, the free end 79 of second member 72 is moved relative to the end 81 of first member 71. As this movement occurs, the second cavity 75 is moved relative to the first cavity 73. This allows the cavities 73, 75 to be adjusted to precisely and accurately position the ends 205 of the substrate 203 therein, and to facilitate the proper and accurate position of the substrate 203 relative to the ends 120 of the wires 111.

With the ends 120 of the wires 111 and the substrate 203 properly positioned as described above, the final positioning of the wires 111 and the soldering of the wires to the conductive elements can then occur. The final positioning and manipulation of the wires is done with a device, such as, but not limited to, the type of robotic gripper sensor device described in U.S. patent application Ser. No. 14/879,569, entitled Robotic Gripper Sensor, filed on even date herewith, which is hereby incorporated by reference in its entirety.

In various embodiments, the manipulation and movement of the wires 111 and the substrate 203 as described herein is done by a computer-controlled robot. Use of the robotic manipulating permits the entire wire positioning and soldering process to be achieved in a briefer period of time and/or by less skilled individuals resulting in a productivity increase of five or more times with respect to the known methods. This allows the process to be used in a production environment, such as, but not limited to, large batch production.

As will be appreciated by those skilled in the art, the fixture and processes described herein are capable of being utilized in conjunction with any suitable soldering technique. Suitable techniques include, but are not limited to, laser soldering, conventional mechanical hot-iron tip soldering, hot-air soldering, and/or electromagnetic inductance soldering.

While the invention has been described with reference to a preferred embodiment, it will be understood by those skilled in the art that various changes may be made and equivalents may be substituted for elements thereof without departing from the spirit and scope of the invention of the invention as defined in the accompanying claims. In particular, it will be clear to those skilled in the art that the present invention may be embodied in other specific forms, structures, arrangements, proportions, sizes, and with other elements, materials, and components, without departing from the spirit or essential characteristics thereof One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A fixture assembly for use with fine wire laser soldering, the fixture comprising:
  a holding and support fixture having
    (a) a wire holding member, and
    (b) a retention member that (i) extends from a first portion of the wire holding member, and (ii) has a U-shaped configuration, a base of the U-shape having a wire retention section, the wire holding member and the retention member cooperating with wires prior to the wires being soldered; and
  a wire securing and tensioning fixture having wire tensioning projections and wire retention members, the wire tensioning projections and wire retention members cooperating with the wires to provide tension to the wire prior to the wires being soldered,
wherein the wire retention section has adhesive coupling which cooperates with the wires to temporarily secure the wires in position.

2. A The fixture assembly for use with fine wire laser soldering, the fixture comprising:
  a holding and support fixture having a wire holding member and a retention member, the wire holding member and the retention member cooperating with wires prior to the wires being soldered; and
  a wire securing and tensioning fixture having wire tensioning projections and wire retention members, respective wire tensioning projections being provided in rows, with three wire tensioning projections in each row, the wire tensioning projections and wire retention members cooperating with the wires to provide tension to the wire prior to the wires being soldered.

3. The fixture assembly as recited in claim 2, wherein the wire holding member of the holding and support fixture has a wire-alignment device positioned proximate a first end of the wire holding member.

4. The fixture assembly as recited in claim 3, wherein the wire-alignment device is positioned in a wire alignment device receiving recess of the holding and support fixture.

5. The fixture assembly as recited in claim 2, wherein the holding and support fixture is removably mounted to a base of the fixture assembly.

6. The fixture assembly as recited in claim 2, wherein a respective wire retention member of the wire retention members is provided in line with each respective row of the rows of wire tensioning projections.

7. The fixture assembly as recited in claim 6, wherein the wire retention members are spaced from the wire tensioning projections, the wire retention members being arranged in a staggered configuration to allow for closer spacing of the rows of wire tensioning projections.

8. The fixture assembly as recited in claim 6, wherein middle wire tensioning projections of each row of wire tensioning projections are provided on a movable member, the moveable member being movable in a direction which is perpendicular to the plane formed by each of the rows of wire tensioning projections.

9. The fixture assembly as recited in claim 6, wherein a substrate adjusting fixture is provided to allow movement of a substrate relative to the wires.

10. The fixture assembly as recited in claim 9, wherein the substrate adjusting fixture has a first member and a second member which is movable relative to the first member, the first member having a first substrate receiving cavity, the second member having a second substrate receiving cavity, the first and second substrate receiving cavities being dimensioned to receive the substrate therein.

11. The fixture assembly as recited in claim 9, wherein the first member is connected to the second member by pulling-adjustment hardware and pushing-adjustment hardware, wherein as the adjustment hardware is moved, a free end of the second member is forced to move relative to a fixed end of the first member, causing the free end of the second member to be moved relative to a first end of the first member, causing the second substrate receiving cavity to be moved relative to the first cavity substrate receiving cavity.

12. A wire securing and tensioning fixture comprising,
  wire tensioning projections, respective wire tensioning projections being provided in rows, with three wire tensioning projections in each row, middle wire tensioning projections of each row of wire tensioning projections being provided on a movable member, the moveable member movable in a direction which is perpendicular to the plane formed by each of the rows of wire tensioning projections, and
  wire retention members, the wire tensioning projections and wire retention members cooperating with the wires to provide tension to the wire prior to the wires being soldered.

13. The fixture assembly as recited in claim 12, wherein a respective wire retention member of the wire retention members is provided in line with each respective row of the rows of wire tensioning projections, the wire retention members being arranged in a staggered configuration to allow for the row of wire tensioning projections.

* * * * *